(12) United States Patent
Ge et al.

(10) Patent No.: US 11,243,326 B2
(45) Date of Patent: Feb. 8, 2022

(54) BOREHOLE IMAGING USING AMPLITUDES OF REFRACTED ACOUSTIC WAVES

(71) Applicant: Halliburton Energy Services, Inc., Houston, TX (US)

(72) Inventors: Yao Ge, Singapore (SG); Wei Li, Singapore (SG); Jing Jin, Singapore (SG); Chung Chang, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 302 days.

(21) Appl. No.: 16/325,306

(22) PCT Filed: Nov. 4, 2016

(86) PCT No.: PCT/US2016/060485
§ 371 (c)(1),
(2) Date: Feb. 13, 2019

(87) PCT Pub. No.: WO2017/131832
PCT Pub. Date: Aug. 3, 2017

(65) Prior Publication Data
US 2019/0204468 A1   Jul. 4, 2019

(51) Int. Cl.
*G06F 11/30* (2006.01)
*G01V 3/38* (2006.01)
*G01V 3/34* (2006.01)
*G01V 3/26* (2006.01)
*G01R 33/12* (2006.01)
*G01V 1/50* (2006.01)
*E21B 47/002* (2012.01)
*E21B 47/26* (2012.01)
*E21B 47/085* (2012.01)
*G01V 1/48* (2006.01)
*G01V 1/46* (2006.01)

(52) U.S. Cl.
CPC .............. *G01V 3/38* (2013.01); *E21B 47/002* (2020.05); *E21B 47/085* (2020.05); *E21B 47/26* (2020.05); *G01R 33/1223* (2013.01); *G01V 1/50* (2013.01); *G01V 3/26* (2013.01); *G01V 3/34* (2013.01); *G01V 1/46* (2013.01); *G01V 1/48* (2013.01); *G01V 2210/63* (2013.01)

(58) Field of Classification Search
CPC ...................................................... G01V 3/38
See application file for complete search history.

(56) References Cited

U.S. PATENT DOCUMENTS 3,333,238 A   7/1967   Caldwell
4,881,208 A   11/1989   Liu
(Continued)

FOREIGN PATENT DOCUMENTS

WO   WO 2013/082480 A1   6/2013

OTHER PUBLICATIONS

Extended Search Report issued for European Patent Application No. 16888549.9, dated Apr. 6, 2020, 7 pages.
(Continued)

*Primary Examiner* — Phuong Huynh
(74) *Attorney, Agent, or Firm* — Haynes and Boone, LLP

(57) ABSTRACT

Acoustic imaging tools and methods use refracted wave amplitudes to generate borehole images, thereby providing a method and tool that is highly sensitive to borehole discontinuities.

20 Claims, 16 Drawing Sheets

(56) References Cited

U.S. PATENT DOCUMENTS

| | | | |
|---|---|---|---|
| 5,644,550 | A | 7/1997 | Priest |
| 6,510,389 | B1 | 1/2003 | Winkler et al. |
| 6,678,616 | B1 * | 1/2004 | Winkler .................. G01V 1/44 |
| | | | 181/104 |
| 8,813,869 | B2 | 8/2014 | Bennett et al. |
| 8,824,240 | B2 | 9/2014 | Roberts et al. |
| 2010/0034052 | A1 | 2/2010 | Pabon et al. |
| 2014/0056101 | A1 | 2/2014 | Vu et al. |
| 2017/0350999 | A1 * | 12/2017 | Merciu .................. E21B 47/00 |

OTHER PUBLICATIONS

Luthi, "Geological Well Logs: Their Use in Reservoir Modeling," Springer Berlin Heidelberg, pp. 124-146, Jan. 1, 2001.
International Search Report and The Written Opinion of the International Search Authority, or the Declaration, dated Feb. 23, 2017, PCT/US2016/060485, 14 pages, ISA/KR.

* cited by examiner

US 11,243,326 B2

BOREHOLE IMAGING USING AMPLITUDES OF REFRACTED ACOUSTIC WAVES

PRIORITY

The present application is a U.S. National Stage patent application of International Patent Application No. PCT/US2016/060485, filed on Nov. 4, 2016, the benefit of which is claimed and the disclosure of which is incorporated herein by reference in its entirety.

FIELD OF THE DISCLOSURE

The present disclosure relates generally to well logging systems and methods and, more specifically, to borehole acoustic imaging using the amplitude of refracted waves.

BACKGROUND

Well logging systems and methods may be used to inspect and evaluate many characteristics of the wellbore, wellbore casing, and the formations through which the wellbore traverses. For both open hole logging and logging-while-drilling ("LWD"), it is important to obtain high resolution images of the borehole to identify dips angles, fractures, washouts and breakouts. The pulse-echo technique employs a transducer which fires an ultrasonic pulse and receives the echo from the borehole. This technique offers high resolution borehole images in both oil-based mud ("OBM") and water-based mud ("WBM") and has been used in wireline tools for more than 40 years.

However, there are multiple challenges applying the pulse-echo technique to LWD, and one major challenge is eccentricity and motion compensation due to vibration. The challenges are presented because pulse-echo signals are sensitive to multiple parameters, such as beam divergence, reflection angle, attenuation along propagation path, etc. All the factors need to be taken into account to acquire a complete deterministic compensation, which requires accurate motion sensing and motion algorithms. Conventional approaches have been unable to solve these challenges, hence there is no acoustic tool commercially available for LWD borehole imaging. Moreover, conventional high resolution imaging tools for LWD are mainly based on microresistivity, which can only be used in water based mud.

DESCRIPTION OF ILLUSTRATIVE EMBODIMENTS

Figure 1:
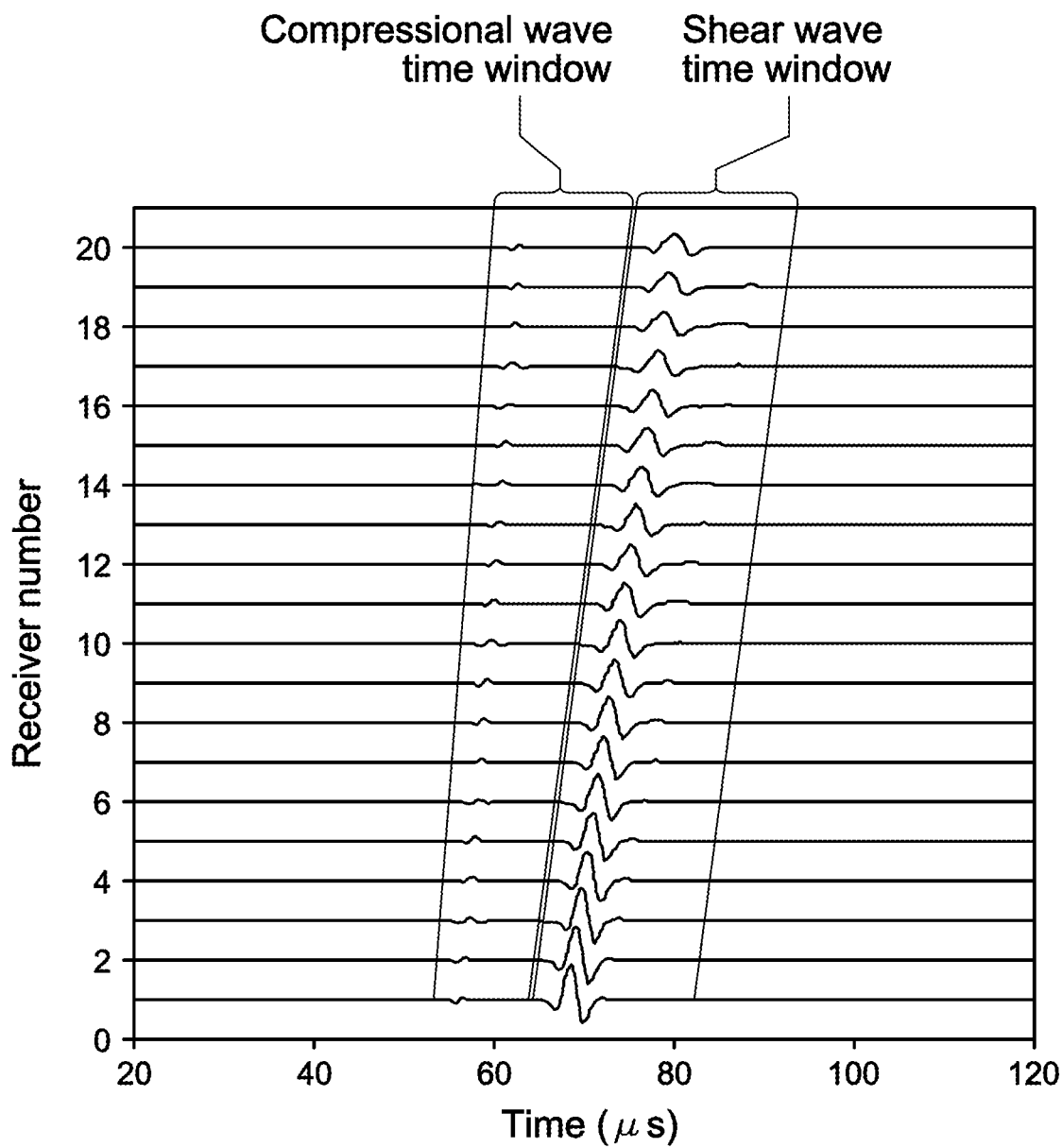
FIG. 1 is a graph showing a sample acoustic waveform based on Finite-Difference Time-Domain simulation, according to certain illustrative methods of the present disclosure.

Illustrative embodiments and related methods of the present disclosure are described below as they might be employed in a downhole method and tool generating acoustic borehole images using the amplitudes of refracted waves. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, illustrative embodiments of the present disclosure provide downhole tools and methods to generate acoustic borehole images using the amplitude of ultrasonic waves. In a generalized method of the present disclosure, an acoustic imaging tool is positioned along a borehole. An ultrasonic pulse is transmitted toward the borehole wall, wherein the ultrasonic pulse interacts with the borehole wall to produce a refracted ultrasonic wave which is received by one or more receivers along the tool. The amplitude of the refracted waves are then calculated and used to generate the image of the borehole wall. The borehole images may then be used to identify fractures in the borehole wall or other discontinuities beneficial in the planning or analysis of downhole operations. Accordingly, the present disclosure provides logging tools and methods which use refracted wave amplitudes to compute the borehole image, thereby providing a method that is highly sensitive to borehole discontinuities (e.g., fractures) or enlargements of the borehole wall due to washout, and can be used independently or in conjunction with velocity imaging methods.

As described in the background section above, conventional imaging tools are challenged because of tool eccentricity and vibration, which results in suboptimal imaging. In certain illustrative embodiments of the present disclosure, however, a pitch-catch technique is applied that is much less prone to eccentricity and vibration, thus providing a more robust option for LWD and wireline applications. The pitch-catch technique overcomes these challenges by firing refracted waves which are received using multiple receivers. Since the standoff variation affects all received signals almost equally, the standoff effect can be removed by processing signals from multiple receivers. "Standoff," as defined herein, means the distance between the external surface of a logging tool and the borehole wall, while "offset" means the distance between the transmitter and the receiver along the external surface of a logging tool. In addition, the pitch-catch method uses refracted waves, which are less sensitive to eccentricity compared to the pulse-echo approach used in many conventional tools.

The fundamental principle of the present disclosure is that the amplitude of refracted acoustic waves decays as the waves propagate along the borehole. However, the rate of amplitude decay should not vary significantly for a borehole section without fractures. As will be described in more detail below, when the refracted acoustic wave encounters a fracture along its propagation path, acoustic energy will be scattered out near the fracture location leading to an increase in the refracted wave amplitude, and after which, a decrease of amplitude with a higher rate of decay will be observed after the fracture location. In certain embodiments, this sudden change of refracted wave amplitude near a fracture location is then detected by an array receiver or multiple receivers when the transmitter and receivers are shifted incrementally along azimuthal or axial directions. The amplitude readings may then be used to generate a reliable borehole image as described herein.

In certain illustrative methods, the amplitude of compressional or shear waves can be measured by average acoustic energy density within the time window $[t_1, t_2]$. The amplitude equation may be expressed as:

$$w = \frac{1}{t_2 - t_1} \int_{t1}^{t2} \frac{1}{2} \frac{p^2}{\rho c^2} dt, \quad \text{Eq. (1)}$$

in the unit of J/m$^3$, where p is the mud pressure, c is the sound speed in mud, and $\rho$ is the density of mud. For a discrete signal of pressure $p_i$, Equation 1 becomes $$w = \frac{1}{n \Delta t} \sum_{i=1}^{n} \frac{1}{2} \frac{p^2}{\rho c^2} \Delta t, \quad \text{Eq. (2)}$$

where $\Delta t$ is the sampling interval and n is the number of sampling interval in the time window.

FIG. 1 is a graph showing a sample ultrasonic waveform based on Finite-Difference Time-Domain ("FDTD") simulation, according to certain illustrative methods of the present disclosure. Here, the graphed model simulates a transmitter firing an ultrasonic pulse at 500 kHz. The refracted wave propagates along a segment of uniform borehole and is received by 20 array receivers. The standoff is 1 inch, offset is 3.8 inch, and the receivers are spaced equally at 0.06 inch. As shown, the compressional wave arrives earlier than shear wave, but with much less amplitude. The time windows used to compute wave amplitude are identified in brackets for compressional and shear waves. In certain illustrative methods, the time window is chosen to cover an adequate time behind the first wave arrival while avoiding interference with other wave arrivals. For example, as shown in FIG. 1, the time window for the compressional waves is selected from the first compressional wave arrival to the first shear wave arrival. The time window for the shear waves start from the first shear wave arrival to a time duration which is calculated, for example, based on wave speed, pulse duration, number of receiver, or receiver spacing. In certain embodiments, it is also important to isolate arrivals of other waves such as, for example, tool arrival, direct fluid arrival, and multiple reflections between transmitter and receiver—which can be achieved by tool design or post processing.

In the case of borehole imaging after a washout, the washout area we will have little or no return signal at the expected time window. Therefore, there will be a blackout zone in terms of the image, and the signal will reappear at the other side of the washout along the borehole axis. Therefore, in certain illustrative methods, the washout zone is mapped (but not the enlarged diameter).

Figure 2A:
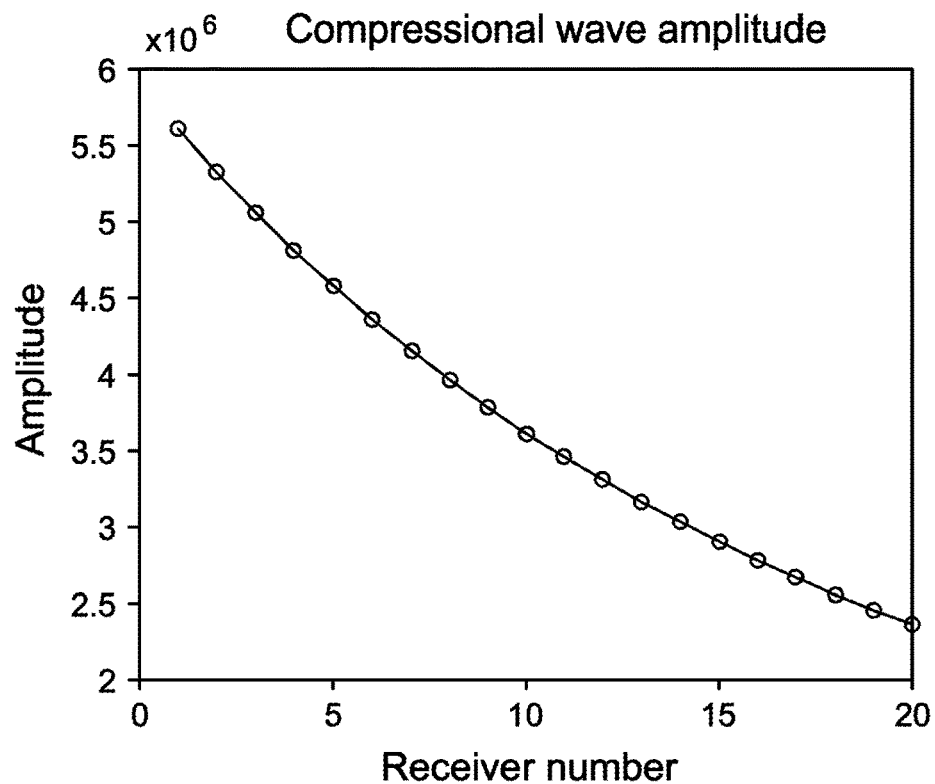
FIGS. 2A, 2B, 3A, and 3B are graphs showing the computed amplitude for the compressional and shear wave of the 20 waveforms of FIG. 1 in linear and log scale, according to certain illustrative methods of the present disclosure.
Figure 2B:
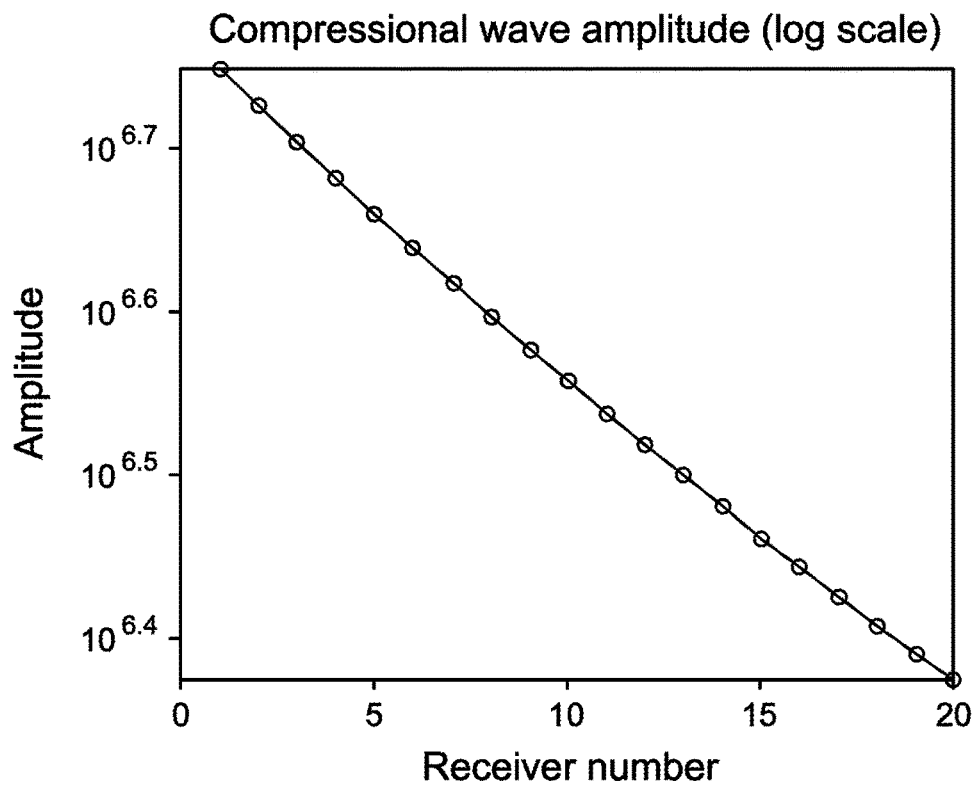
Figure 3A:
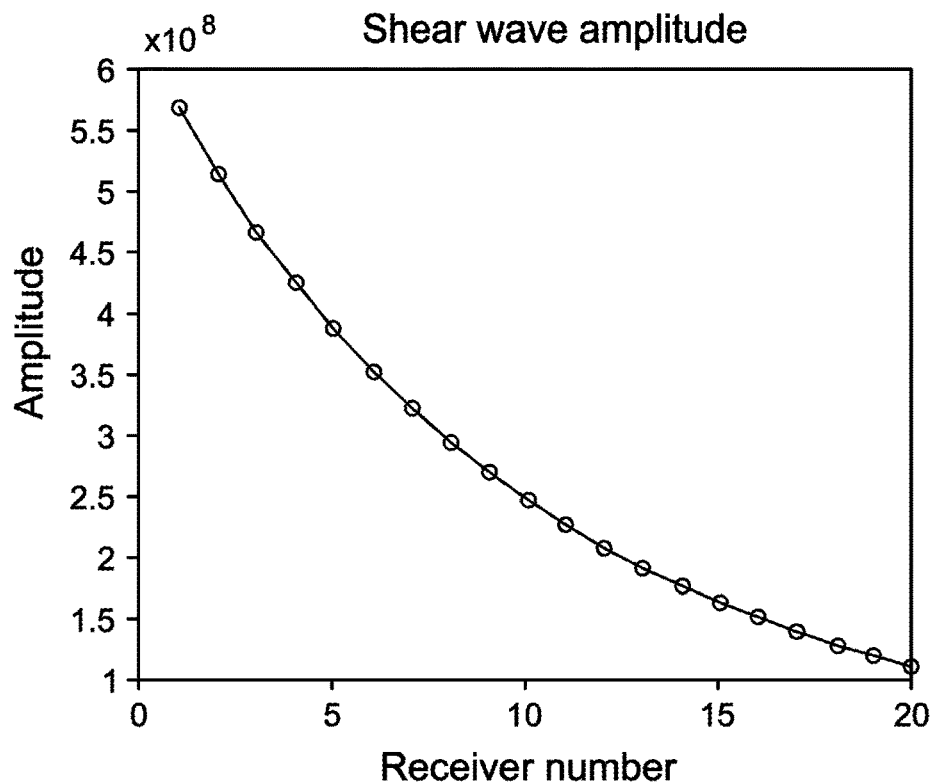
Figure 3B:
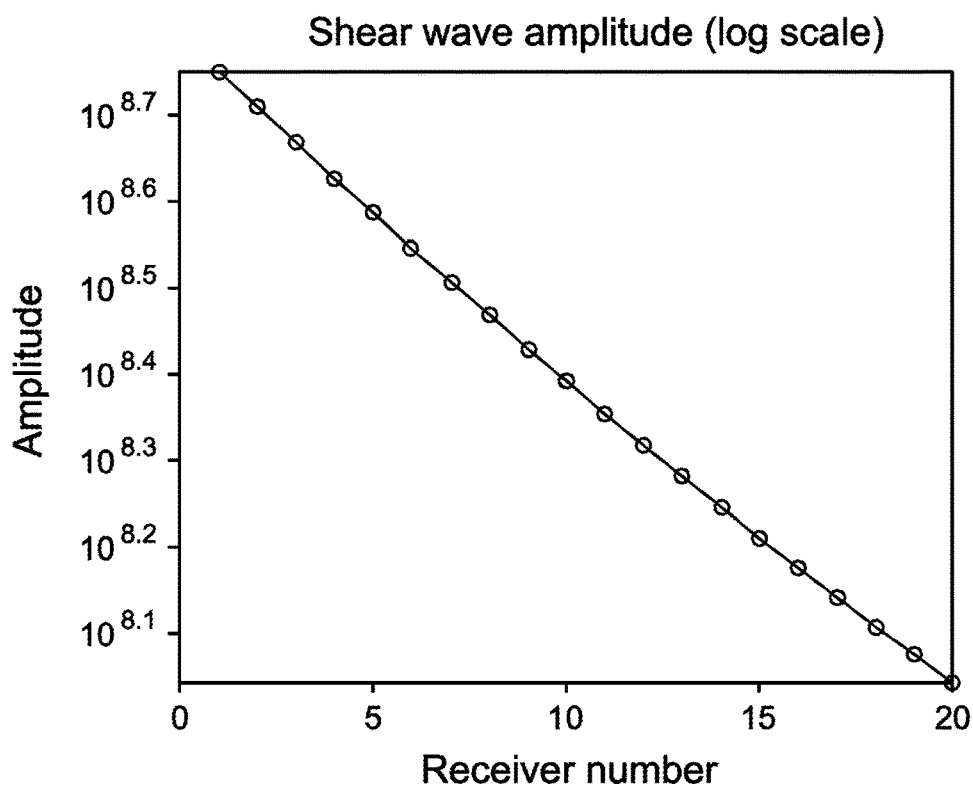

FIGS. 2A, 2B, 3A, and 3B are graphs showing the computed amplitude for the compressional and shear wave of the 20 waveforms of FIG. 1 in linear and log scale, according to certain illustrative methods of the present disclosure. The amplitude may be computed in a number of ways such as, for example, using Equation 2 above. FIGS. 2A and 3A show the linear scale for compressional and shear wave amplitudes, respectively, while FIGS. 2B and 3B show the log scale for compressional and shear wave amplitudes, respectively. As shown in FIGS. 2A-3B, the amplitude for both compressional and shear wave shows exponential decay, which, in certain methods herein, is approximated as a linear trend when plotted in log scale, as shown in FIGS. 2B and 3B. In other embodiments, however, the decay pattern may be approximated with other trends, such as, for example, exponential, inverse power or a combination of these trends. As will be described below, deviation from this linear pattern is used to identify fractures and other discontinuities in the illustrative embodiments of methods described herein.

Figure 4:
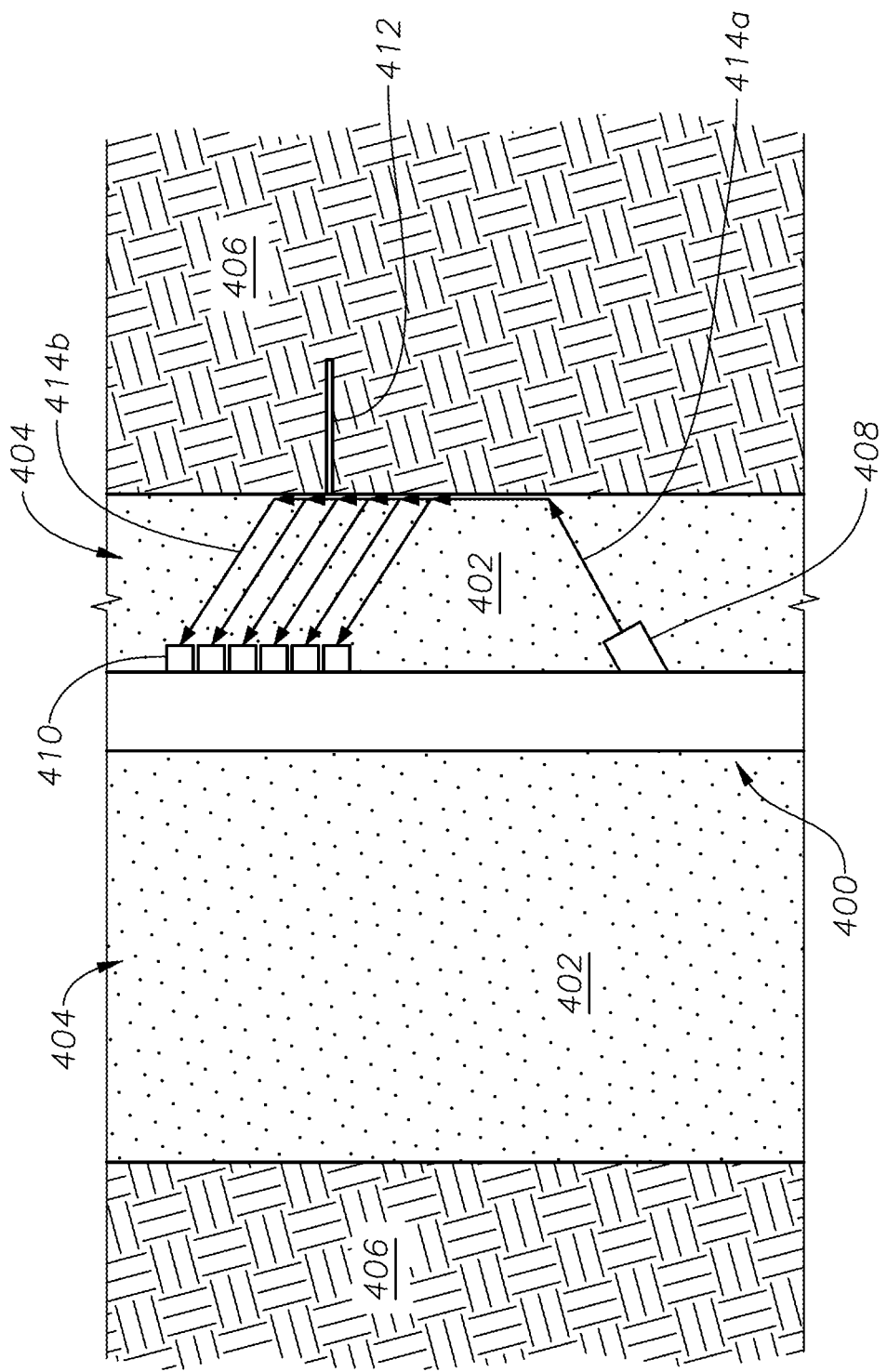
FIG. 4 shows an acoustic imaging tool positioned along a borehole, according to certain illustrative embodiments of the present disclosure.

Now that the underlying theory of the present disclosure has been described, various illustrative acoustic tool designs will now be described. FIG. 4 shows an acoustic imaging tool positioned along a borehole, according to certain illustrative embodiments of the present disclosure. Acoustic tool 400 is positioned within a borehole 402 in an eccentric manner. Borehole 402 is filled with mud 404, surrounded by formation 406. Acoustic tool 400 includes a transmitter 408 and receiver array 410. Transmitters 408 may be, for example, piezoelectric, piezoresistive or electromagnetic transmitters, and receivers 410 may be piezoelectric, piezoresistive or electromagnetic receivers. A discontinuity (e.g., fracture/crack/wall irregularities) 412 is positioned along the wall of borehole 402. During operation of acoustic tool 400, transmitter(s) 408 emits an acoustic wave 414a, which then travels along the wall of borehole 402, and is refracted (as refracted waves 414b) adjacent discontinuity 314, where they are received by receiver array 410. Once received, the amplitudes of refracted waves 414b are computed.

Figure 5A:
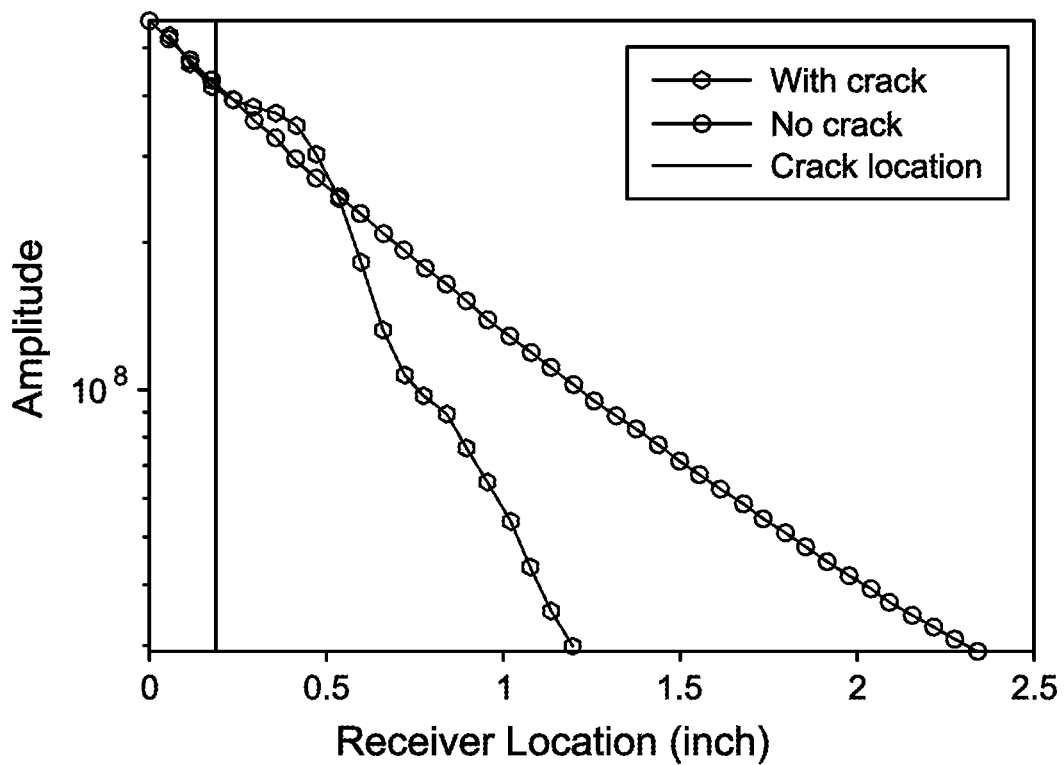
FIGS. 5A, 5B, and 5C plot the amplitude of refracted shear waves at 3 borehole wall crack positions.
Figure 5B:
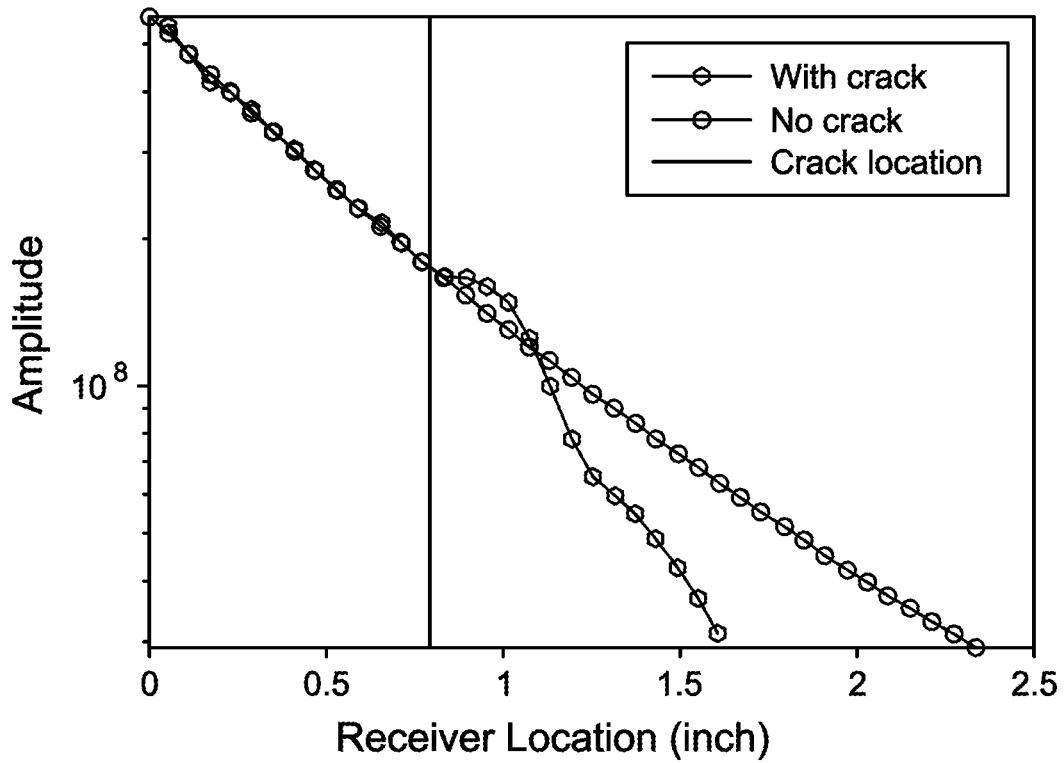
Figure 5C:
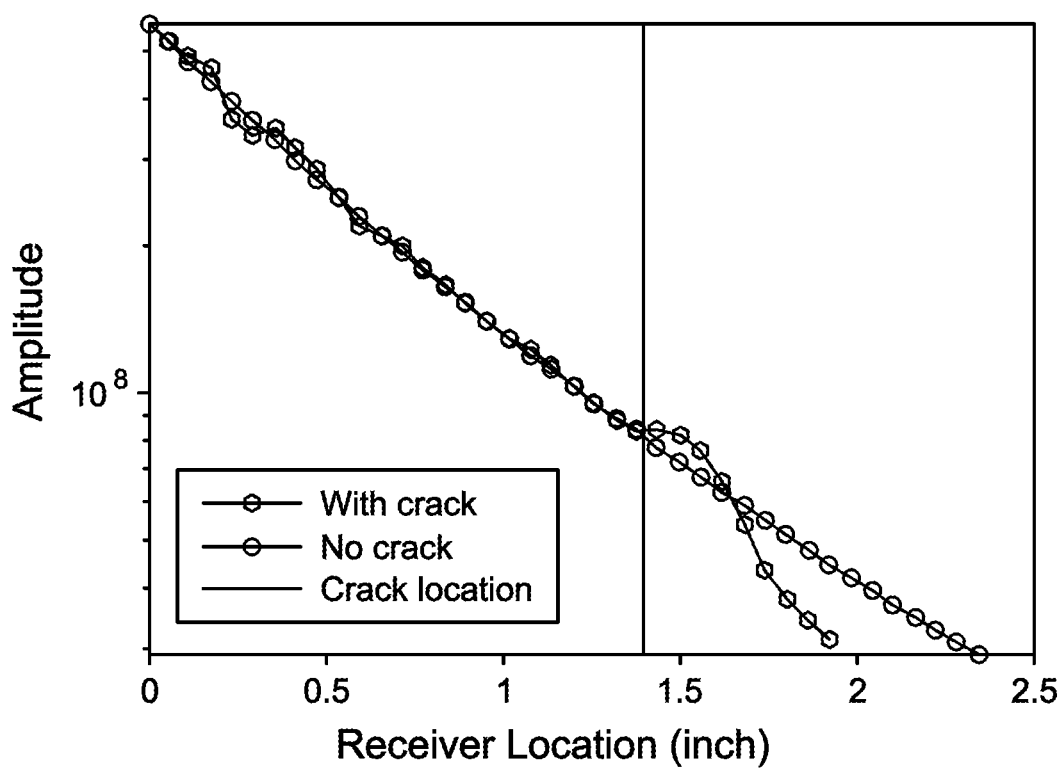

With reference to FIG. 4, three different cases were simulated wherein crack 412 was located at different positions along the wall of borehole 402. The amplitude of refracted shear waves at each of the three positions (with a 1 inch standoff) are plotted in FIGS. 5A, 5B, and 5C. The result for a case with no crack is also plotted in FIGS. 5A-5C for comparison. All three plots in FIGS. 5A-5C show the presence of a crack/discontinuity/wall irregularities can be identified as an increase of amplitude caused by scattering of the refracted wave. As can be seen, the increase in amplitude arrives slightly later than the actual crack location, which is because the refracted waves propagate from borehole surface to the receivers in an oblique direction, causing a shift in the location identified on the receivers.

Figure 6:
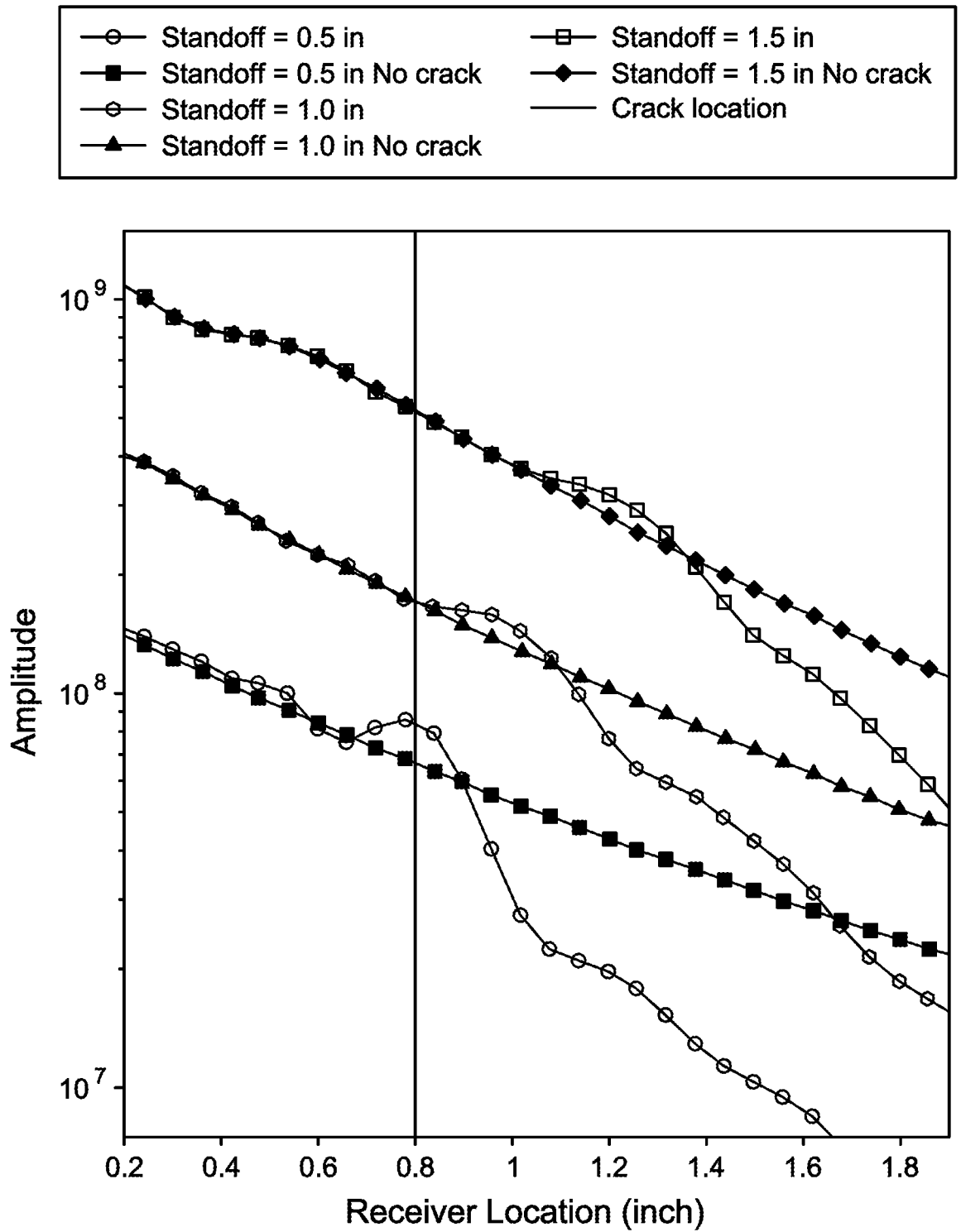
FIG. 6 is a graph showing the effect of standoff for a discontinuity at the same location along the borehole wall.

FIG. 6 is a graph showing the effect of standoff for a discontinuity at the same location along the borehole wall. As can be seen, the increase of amplitude is more distinct (with higher amplitude and narrower spread between receivers) for cases with lower standoff. This allows the location of the fracture to be accurately measured, and may be favorable for LWD tool as the collar is thicker and the transmitter and receiver needs to be installed closer to the borehole compare to wireline tools. Moreover, the standoff does not vary significantly with the use of a stabilizer to minimize lateral movement of the tool.

Figure 7:
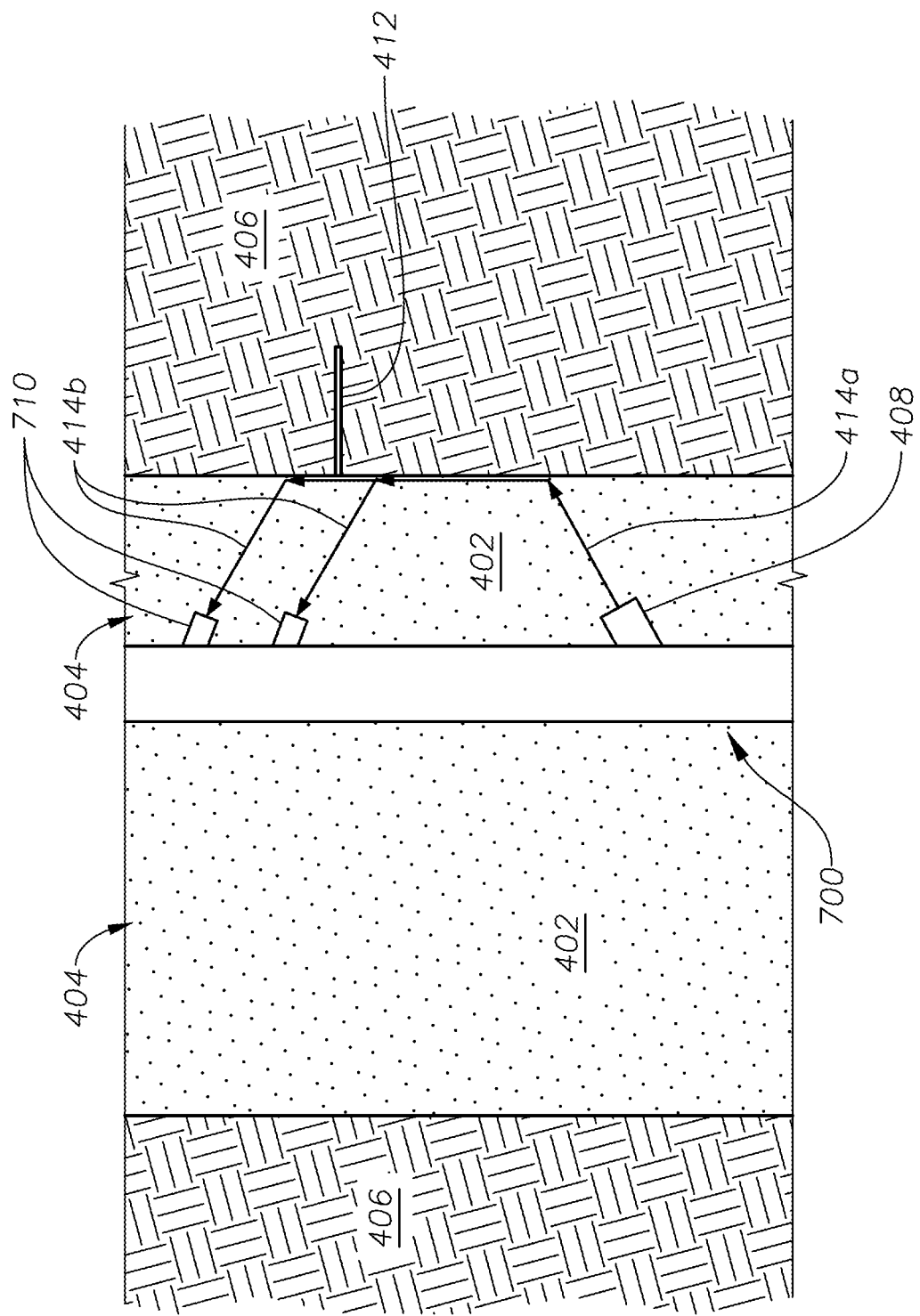
FIG. 7 shows an acoustic imaging tool positioned along a borehole, according to certain alternative illustrative embodiments of the present disclosure.

FIG. 7 shows an acoustic imaging tool positioned along a borehole, according to certain alternative illustrative embodiments of the present disclosure. Acoustic imaging tool 700 is similar to acoustic tool 400, so like numerals refer to like elements. However, acoustic imaging tool 700 employs a transmitter 408 and at least two receivers 710. In this example, 13 cases (i.e., shifts of receivers) were simulated with the transmitter and receivers shifted by 0.12 inch each shift along the borehole axis. The two receivers 710 were spaced 1.3 inch apart with a standoff of 1 inch and offset of 3.8 inches.

Figure 8:
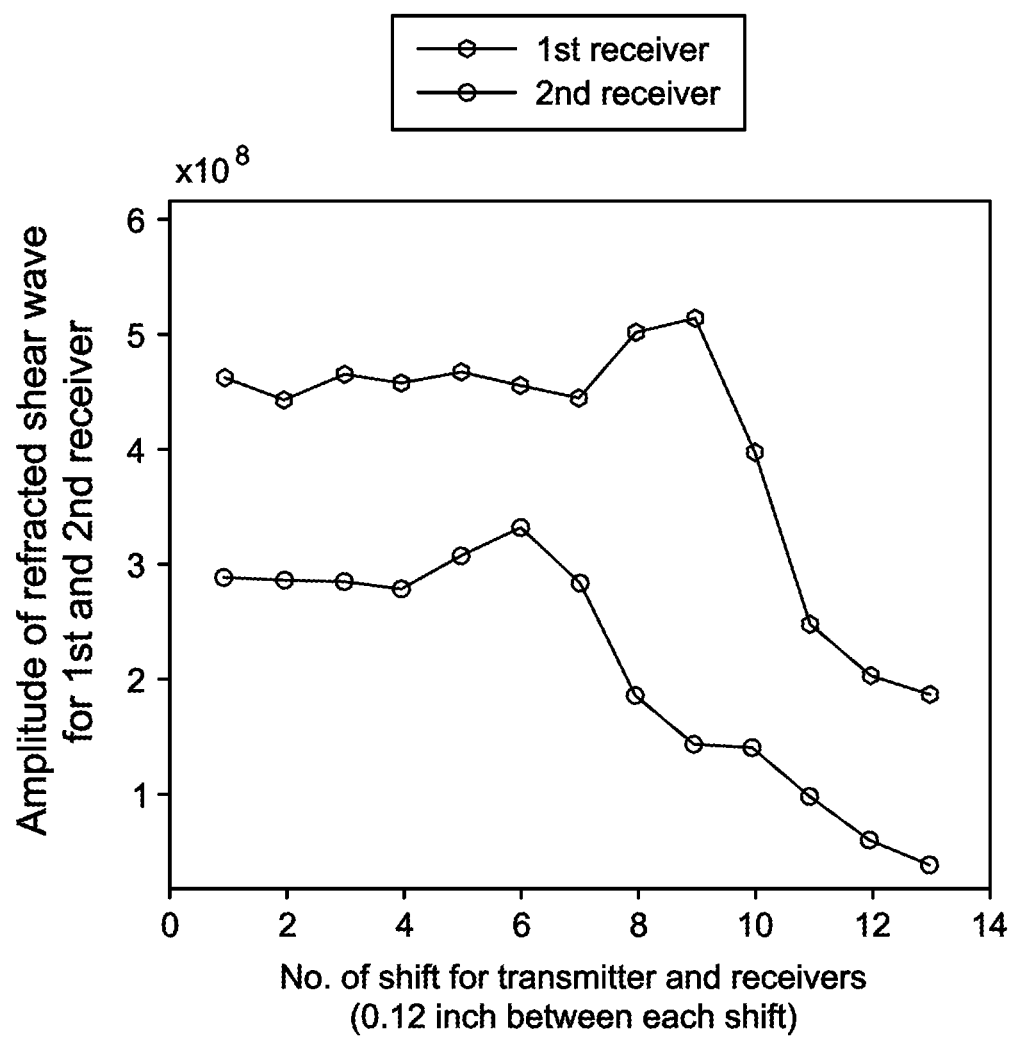
FIG. 8 plots the amplitude of the refracted shear wave for two receivers being shifted in 13 positions.
Figure 9:
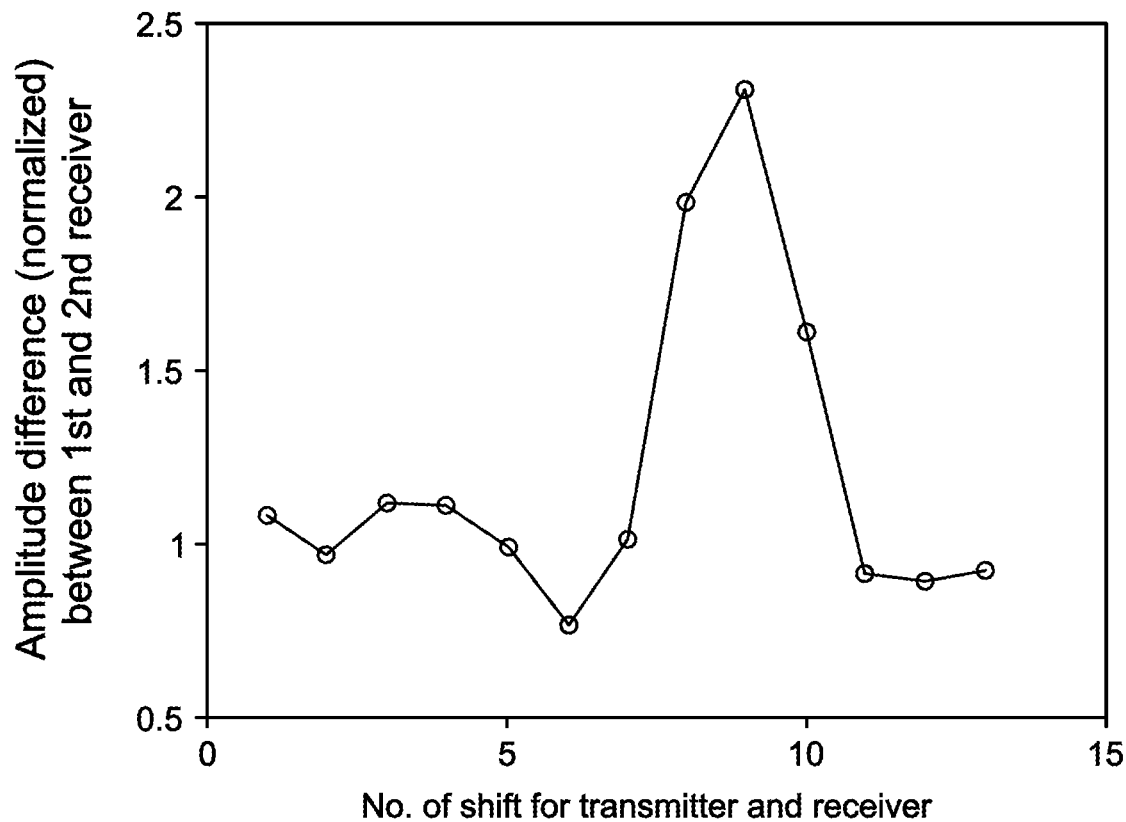
FIG. 9 plots the normalized amplitude difference between two receivers based on 13 sets of data where the transmitter and receiver are shifted.

The amplitude of the refracted shear wave for two receivers in each of the 13 shifts was computed and plotted in FIG. 8. As can be seen, the amplitude data remains flat before a discontinuity, increases at the discontinuity location, and decrease thereafter. Hence, the increase of amplitude indicates the presence of a discontinuity. To remove the effect of standoff in amplitude variation, the difference in the response of two receivers can be used to identify the fracture location which is plotted in FIG. 9, which shows the normalized amplitude difference between the two receivers based on 13 sets of data with transmitter and receiver shifted (standoff 1 inch, offset 3.8 inches, receiver spacing 0.3 inches, each shift 0.12 inches). The peak value in FIG. 9 (i.e., shift 9) corresponds to the peak value at the 1st receiver in FIG. 8. The slight decrease of value in amplitude of FIG. 9 (at shift 5) is due to the initial increase of amplitude for the second receiver at shift 5 of FIG. 8.

In the illustrative examples described herein, the acoustic measurements may be acquired in a number of ways including axially shifting the tool along the borehole. For example, the acoustic tool may be deployed into a desired axial position along the borehole, held in place, then acoustic waves are fired and received, whereby amplitude data is calculated. The tool is then shifted to a second axial location, held in place, and more acoustic signals are acquired as desired. In other embodiments, however, the tool is shifted radially while the data is collected along the same azimuthal angle and incremental depth. For example, in LWD, the acoustic tool is connected along the drill string, which rotates in the borehole and penetrates into the formation. In wireline application, the tool is centralized in the borehole, being pulled by wireline to surface while rotating. In such examples, the acoustic tool repeatedly fires and receives ultrasonic signal when it is rotating azimuthally and shifting radially/azimuthally at the same time. The ultrasonic wave travels much faster than the rotation of the tool, so that the relative movement of the tool between time of firing and receiving is negligible. With repeated data acquisition, signal from all azimuthal angles and depths are collected. During processing, the data collected from the same azimuthal angle and incremental depth are selected for processing.

Figure 10:
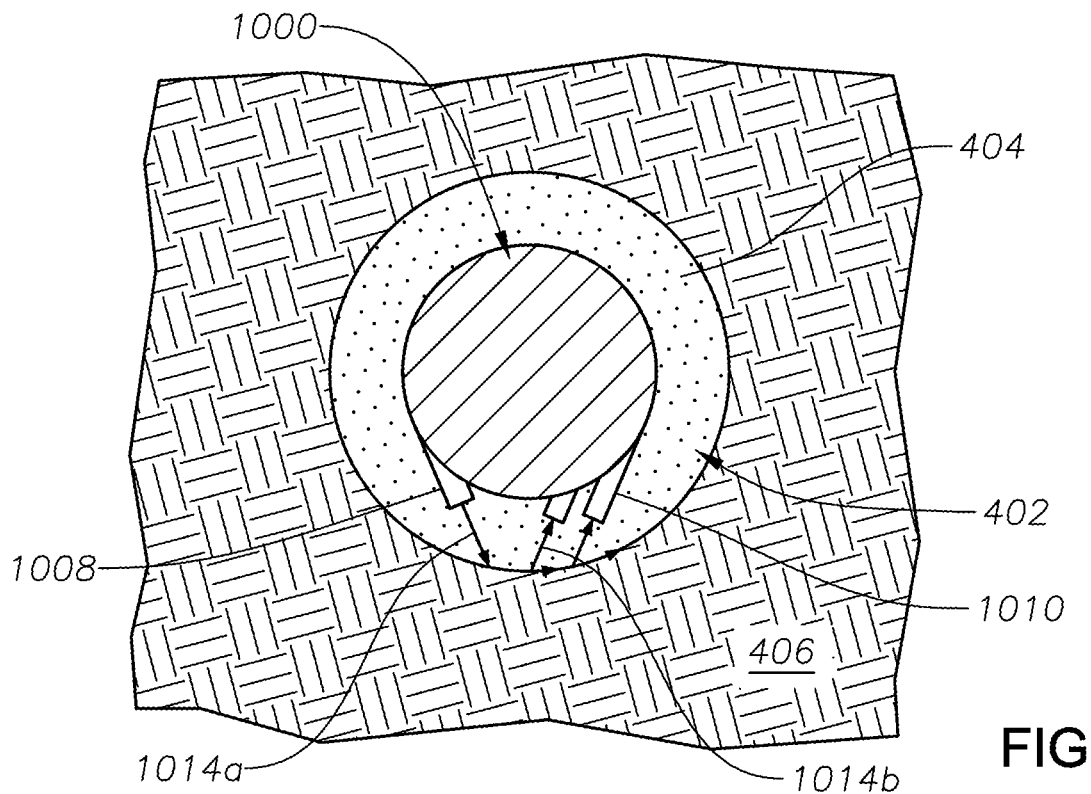
FIG. 10 illustrates an alternative embodiment of an acoustic imaging tool which is shifted in a radial or azimuthal manner, according to certain illustrative embodiments of the present disclosure.

FIG. 10 illustrates an alternative embodiment of an acoustic imaging tool which is shifted in a radial or azimuthal manner, according to certain illustrative embodiments of the present disclosure. Acoustic imaging tool 1000 is illustrated in a sectional fashion looking down borehole 402. In the embodiment, transmitter 1008 and two receivers 1010 are positioned along the same plane around the body of tool 1008. In one illustrative method, during operation tool 1000 is positioned downhole and held in place, then transmitter 1008 fires an ultrasonic pulse 1014a toward the wall of borehole 402, which then travels along the wall of borehole 402 in a radial manner. Receivers 1010 then receive the refracted ultrasonic wave 1014b. After acquisition of the first refracted ultrasonic waves, tool 1000 is shifted radially, transmitter 1008 is fired, and more acoustic waves are acquired, whereby the amplitudes are calculated as described herein, and used to image the borehole. In other methods, the tool is constantly rotating and translating in the borehole connecting to either wireline or drill string. The acoustic tool repeatedly fires and receives signal along various azimuthal angle and depth. Finally, in either example, the data collected from the same depth and incremental azimuthal angles are selected for processing.

Figure 11A:
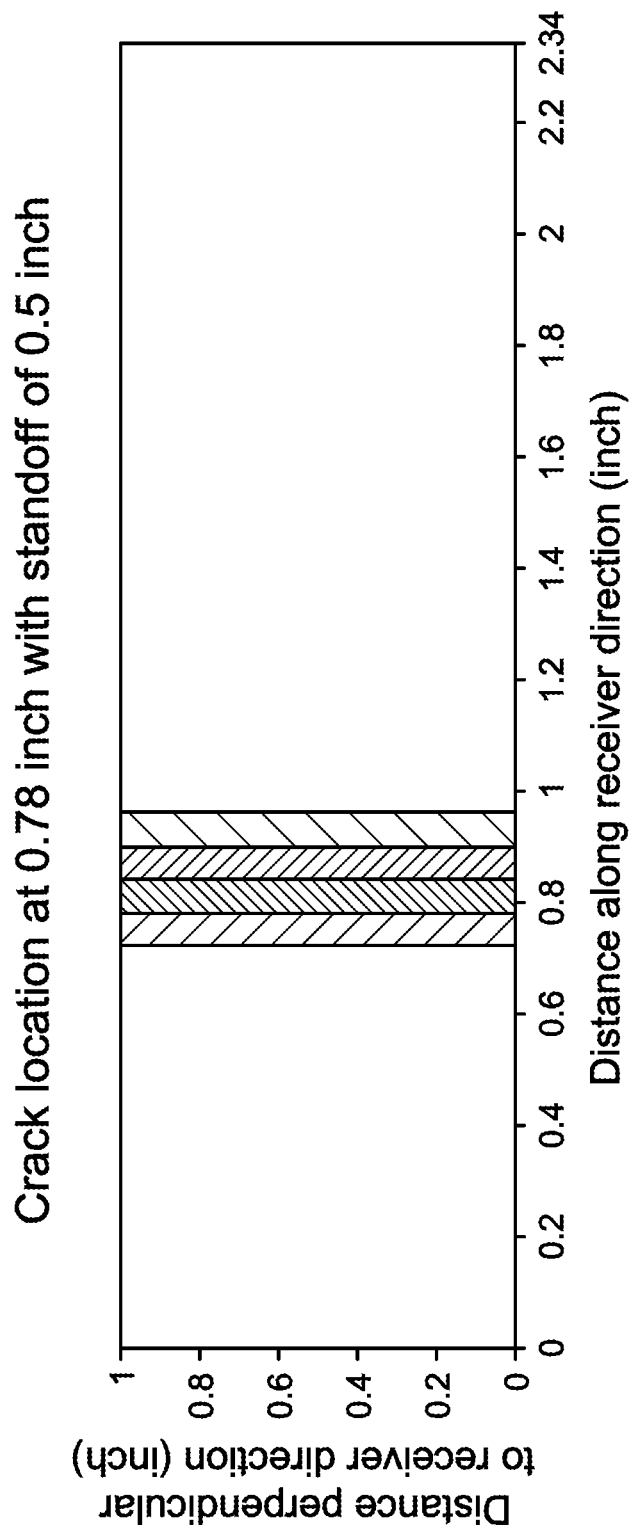
FIG. 11A is a two-dimension borehole image generated using an illustrative method of the present disclosure.

FIG. 11A is a two-dimension borehole image generated using an illustrative method of the present disclosure. The image is generated using spatial information. To generate the image, time (converted to distance) and tool rotation are combined. Therefore, the time data from the reflection is used, in addition to the speed of the medium, to covert the time to the axial distance. This conversion is performed at each angular position of the tool to obtain the azimuthal spatial info. Therefore, the 2D fracture image can be produced by using both axial and azimuthal coordinates of the fracture reflectors.

Figure 11B:
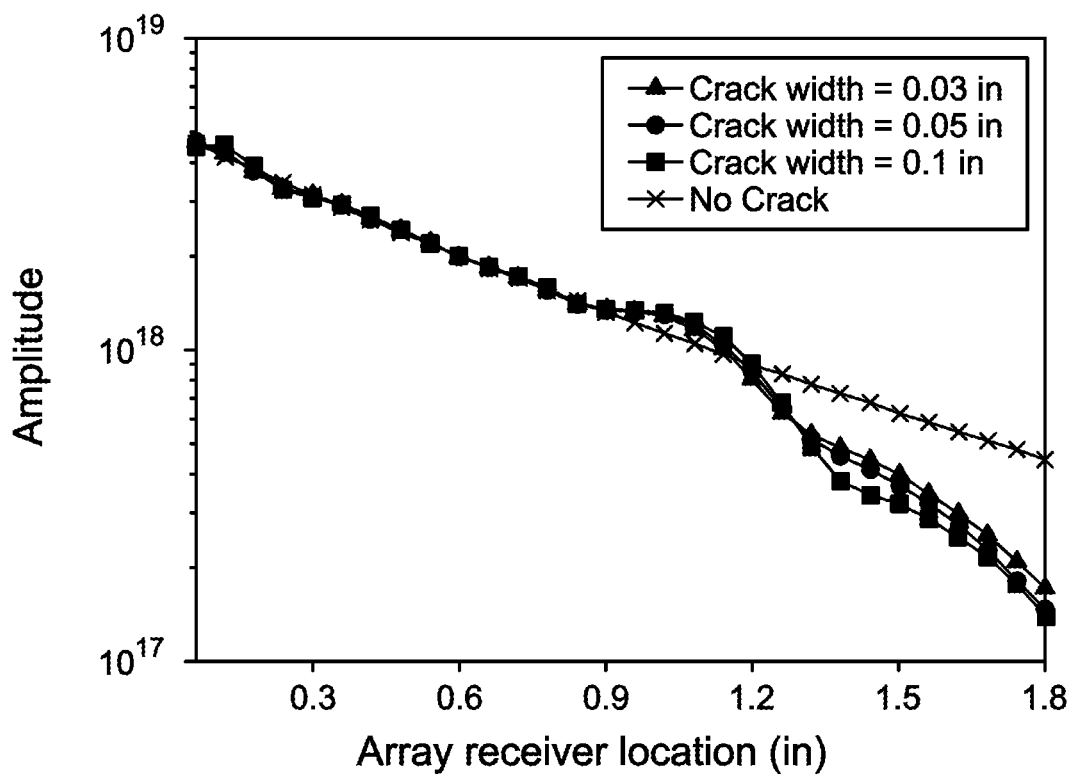
FIGS. 11B and 11C plot the effect of a crack width and depth, respectively, according to certain illustrative methods of the present disclosure.
Figure 11C:
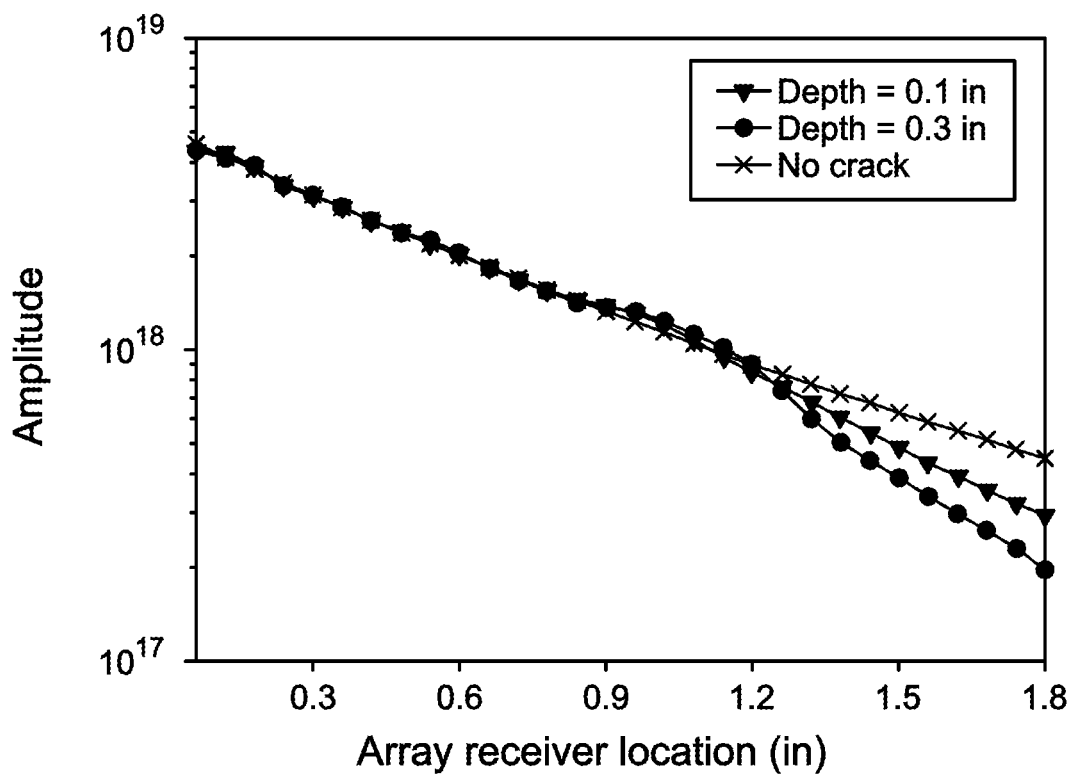

In FIG. 11A, a sample image is shown which was plotted based on simulation result of 0.5 inch standoff of FIG. 6. The fracture is located at 0.78 inches from the first receiver, and the fracture is assumed to be unchanged along the perpendicular direction. The amplitude of the fracture image was taken as the difference between the amplitude of refracted shear wave for the fracture case and the amplitude of normal decay trend (case without a fracture), at the portion where the amplitude increases above the normal decay trend. In this example, the amplitude of the image is related to the width and depth of the fracture. As shown in FIGS. 11B and 11C, the amplitude is higher for fractures with larger widths and depths. In certain other illustrative methods, the location of the fracture image can also be determined by back propagating the corresponding receiver location to the borehole, according to the oblique angle at which the refracted waves propagate (as shown in FIG. 4). The angle is the critical angle of the refracted wave which can be calculated from the ratio between the refracted wave velocity and fluid velocity.

In summary, the amplitude of refracted waves are sensitive to borehole fractures and other discontinuities. In the illustrative embodiment of FIG. 4, an array receiver covering at least about 0.5 inch with good receiver spacing is utilized to acquire the refracted signals, thus negating the need for multiple shifts along the borehole. A discontinuity may be identified by a local increase of amplitude using one set of array receiver data without shifting the transmitter and receivers. As such, acoustic imaging tool 400 allows less sampling along the borehole axial direction. With the use of acoustic tools 700 or 100, however, a less number of receivers is required, but more sampling along the borehole axial and radial directions is needed to provide sufficient resolution.

Figure 12A:
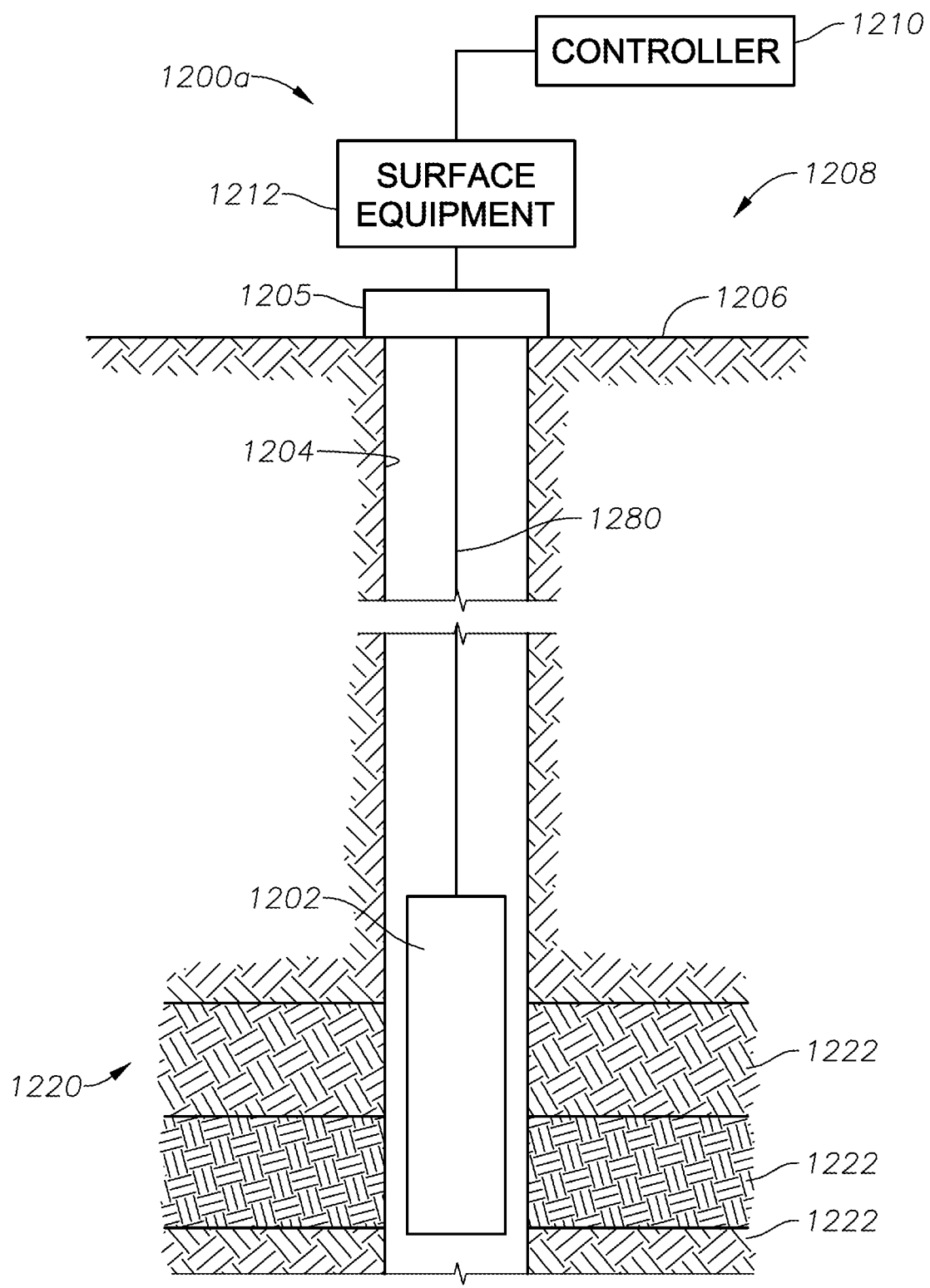
FIGS. 12A, 12B, and 12C are diagrams of illustrative well system applications of the present disclosure.

Now various applications of the present disclosure will be described. FIG. 12A is a diagram of an illustrative well system 1200*a*. Well system 1200*a* includes a logging system 1208 and a subterranean region 1220 beneath the ground surface 1206. A well system can include additional or different features that are not shown in FIG. 12A. For example, the well system 1200*a* may include additional drilling system components, wireline logging system components, etc.

The subterranean region 1220 can include all or part of one or more subterranean formations or zones. The subterranean region 1220 shown in FIG. 12A includes multiple subsurface layers 1222 and a wellbore 1204 penetrating the subsurface layers 1222. The subsurface layers 1222 can include sedimentary layers, rock layers, sand layers, or combinations of these other types of subsurface layers. One or more of the subsurface layers can contain brine, oil, gas, etc. Although wellbore 1204 shown in FIG. 12A is a vertical wellbore, the logging system 1208 can be implemented in other wellbore orientations. For example, the logging system 1208 may be adapted for horizontal wellbores, slant wellbores, curved wellbores, vertical wellbores, or combinations of these.

The illustrative logging system 1208 includes an acoustic imaging tool 1202, surface equipment 1212, and a tool controller 1210. In the example shown in FIG. 12A, acoustic imaging tool 1202 is a downhole acoustic imaging tool that operates while disposed in wellbore 1204, as described herein. The example surface equipment 1212 shown in FIG. 12A may operate at or above the surface 1206, for example, near a well head 1205 of wellbore 1204, to position acoustic imaging tool 1202 and optionally other downhole equipment or other components of the well system 1200*a*. Tool controller 1210 may be operable to control surface equipment and to receive and analyze logging and imaging data from the acoustic imaging tool 1202. Logging system 1208 can include additional or different components or features, and such may be arranged and operated as represented in FIG. 12A or in another suitable manner.

In some instances, all or part of tool controller 1210 can be implemented as a component of, or can be integrated with one or more components of, the surface equipment 1212, the acoustic imaging tool 1202, or both to implement the methods described herein. In some cases, tool controller 1210 can be implemented as one or more discrete computing system structures separate from surface equipment 1212 and acoustic imaging tool 1202. In some implementations (not illustrated), controller 1210 may be located entirely within acoustic imaging tool 1202, and controller 1210 and acoustic imaging tool 1202 can operate concurrently while disposed in wellbore 1204. Although tool controller 1210 is shown above surface 1206 in the example shown in FIG. 12A, all or part of the tool controller 1210 may reside below surface 1206, for example, at or near the location of the acoustic imaging tool 1202.

Well system 1200*a* can include communication or telemetry equipment that provides a communication link 1280 between tool controller 1210, acoustic imaging tool 1202, and optionally other components of the logging system 1208. For example, the components of logging system 1208 can each include one or more transceivers or similar apparatus for wired or wireless data communication among the various components. The logging system 1208 can include systems and apparatus for wireline telemetry, wired pipe telemetry, mud pulse telemetry, acoustic telemetry, electromagnetic telemetry, or a combination of these other types of telemetry. In some cases, acoustic imaging tool 1202 receives commands, status signals, or other types of information from tool controller 1210 or another source. In some cases, tool controller 1210 receives logging data, status signals, or other types of information from acoustic imaging tool 1202 or another source.

Logging operations can be performed in connection with various types of downhole operations at various stages in the lifetime of a well system. Structural attributes and components of surface equipment 1212 and acoustic imaging tool 1202 can be adapted for various types of logging operations. For example, logging may be performed during drilling operations, during wireline logging operations, or in other contexts. As such, surface equipment 1212 and acoustic imaging tool 1202 may include, or may operate in connection with drilling equipment, wireline logging equipment, or other equipment for other types of operations.

Figure 12B:
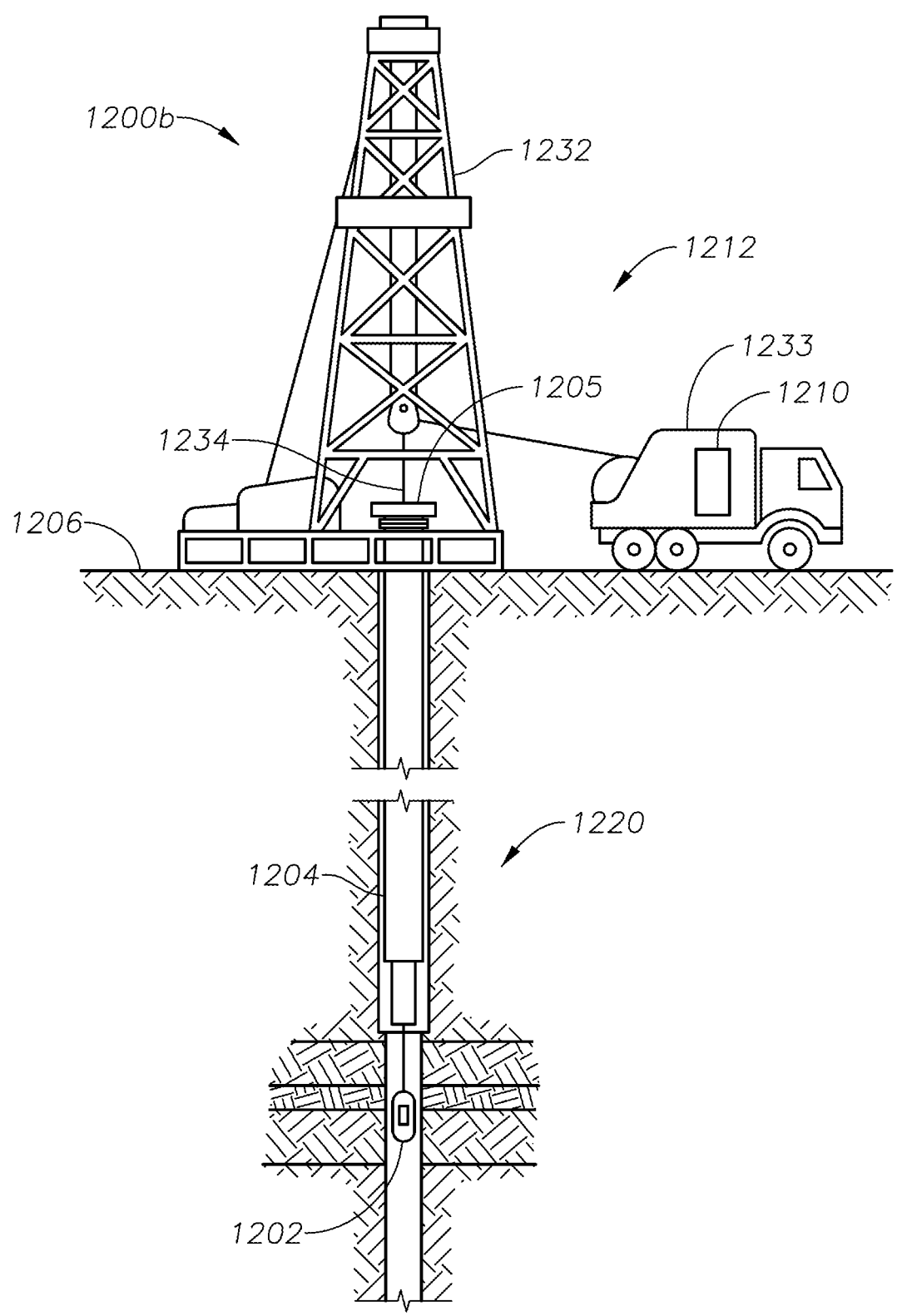

In some examples, logging operations are performed during wireline logging operations. FIG. 12B shows an exemplary well system 1200*b* that includes acoustic imaging tool 1202 in a wireline logging environment. In some example wireline logging operations, surface equipment 1212 includes a platform above surface 1206 that is equipped with a derrick 1232 or a winch 1233 that supports a conveyance 1234 that extends into wellbore 1204. Wireline logging operations can be performed, for example, after a drilling string is removed from wellbore 1204 to allow acoustic imaging tool 1202 to be lowered by wireline or logging cable into the wellbore 1204.

As shown, for example, in FIG. 12B, acoustic imaging tool 1202 can be suspended in wellbore 1204 by a conveyance 1234, which may be a coiled tubing, wireline cable, or another structure that connects the tool to a surface control unit or other components of surface equipment 1212. In some implementations, acoustic imaging tool 1202 is lowered to the bottom of a region of interest and subsequently pulled upward (e.g., at a substantially constant speed) through the region of interest.

Figure 12C:
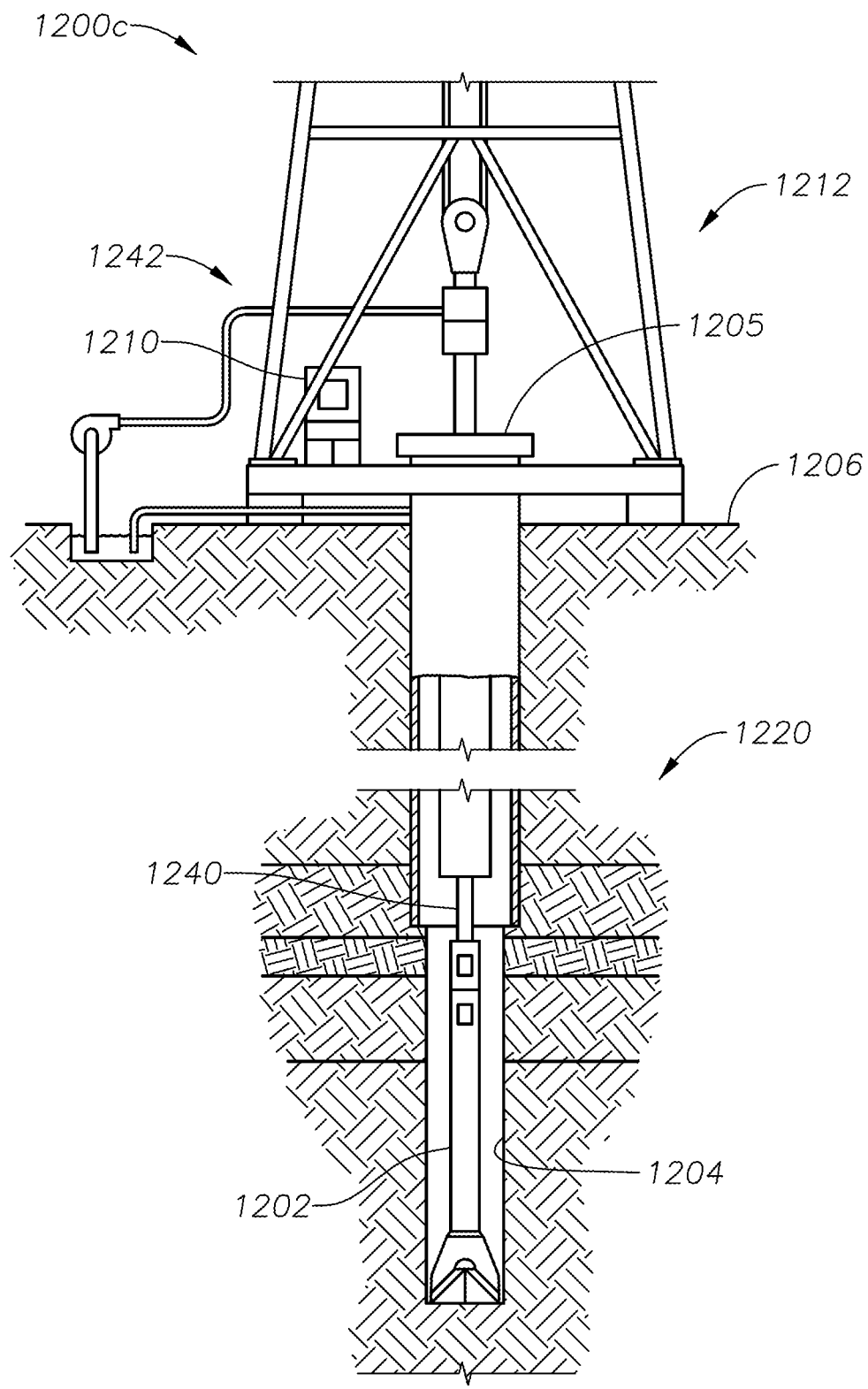

In some examples, logging operations are performed during drilling operations. FIG. 12C shows an exemplary well system 1200*c* that includes acoustic imaging tool 1202 in an LWD environment. Drilling is commonly carried out using drill pipes connected together to form a drill string 1240 that is lowered through a rotary table into wellbore 1204. In some cases, a drilling rig 1242 at surface 1206 supports drill string 1240, as drill string 1240 is operated to drill a wellbore penetrating subterranean region 120. Drill string 1240 may include, for example, a kelly, drill pipe, a bottom hole assembly, and other components. The bottom hole assembly may include drill collars, drill bits, acoustic imaging tool 1202, and other components.

Acoustic imaging tool 1202 can be deployed in the wellbore 1204 on jointed drill pipe, hardwired drill pipe, or other deployment hardware. In some implementations, acoustic imaging tool 1202 collects data during drilling operations as it moves downward through the region of interest during drilling operations, as described herein. In some implementations, acoustic imaging tool 1202 collects data while the drilling string 1240 is moving, for example, while it is being run in or tripped out of wellbore 1204. In other embodiments, however, acoustic imaging tool 1202 is held in place, acoustic measurements are acquired, the tool is shifted, more signals are acquired, etc., as described herein.

In some implementations, acoustic imaging tool 1202 collects data at discrete logging points in the wellbore 1204. For example, acoustic imaging tool 1202 can move upward or downward incrementally (or radially) to each logging point at a series of depths in wellbore 1204. At each logging point, instruments in acoustic imaging tool 1202 perform measurements within the wellbore. The measurement data can be communicated to tool controller 1210 for storage, processing, and analysis. Such data may be gathered and analyzed during drilling operations (e.g., during LWD operations), during wireline logging operations, or during other types of activities.

Tool controller 1210 can receive and analyze the measurement data from acoustic imaging tool 1202 to detect and characterize fluid flow, provide images of the wellbore and other objects within the wellbore, such as fractures, sand, stuck pipe, scale, and characterize the casing inner wall, its dimensions, and the presence or absence of features along the casing wall, as described herein.

In addition to wireline or LWD applications, the embodiments disclosed herein may be deployed via slickline, coil tubing, measurement-while-drilling ("MWD") or other downhole tubular assemblies. Regardless of the application selected, the acoustic tools are coupled to processing circuitry (e.g., controllers) that act as a data acquisition and/or processing system to analyze amplitude data and perform the methods described herein. Although not shown, the processing circuitry may include at least one processor, a non-transitory, computer-readable storage (also referred to herein as a "computer-program product"), transceiver/network communication module, optional I/O devices, and an optional display (e.g., user interface), all interconnected via a system bus. In one embodiment, the network communication module is a network interface card ("NIC") and communicates using the Ethernet protocol. In other embodiment, the network communication module may be another type of communication interface such as a fiber optic interface and may communicate using a number of different communication protocols. Software instructions executable by the processor for implementing software instructions in accordance with the illustrative methods described herein, may be stored in storage or some other computer-readable medium.

The processing circuitry may be connected to one or more public (e.g., the Internet) and/or private networks via one or more appropriate network connections. It will also be recognized that the software instructions may also be loaded into storage from a CD-ROM or other appropriate storage media via wired or wireless methods.

Moreover, those ordinarily skilled in the art will appreciate that embodiments of the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. Embodiments of the disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system. Subject to network reliability, the imaging techniques described herein may be performed in real-time to update production, enhance oil recovery ("EOR") operations, and/or other operations.

Figure 13:
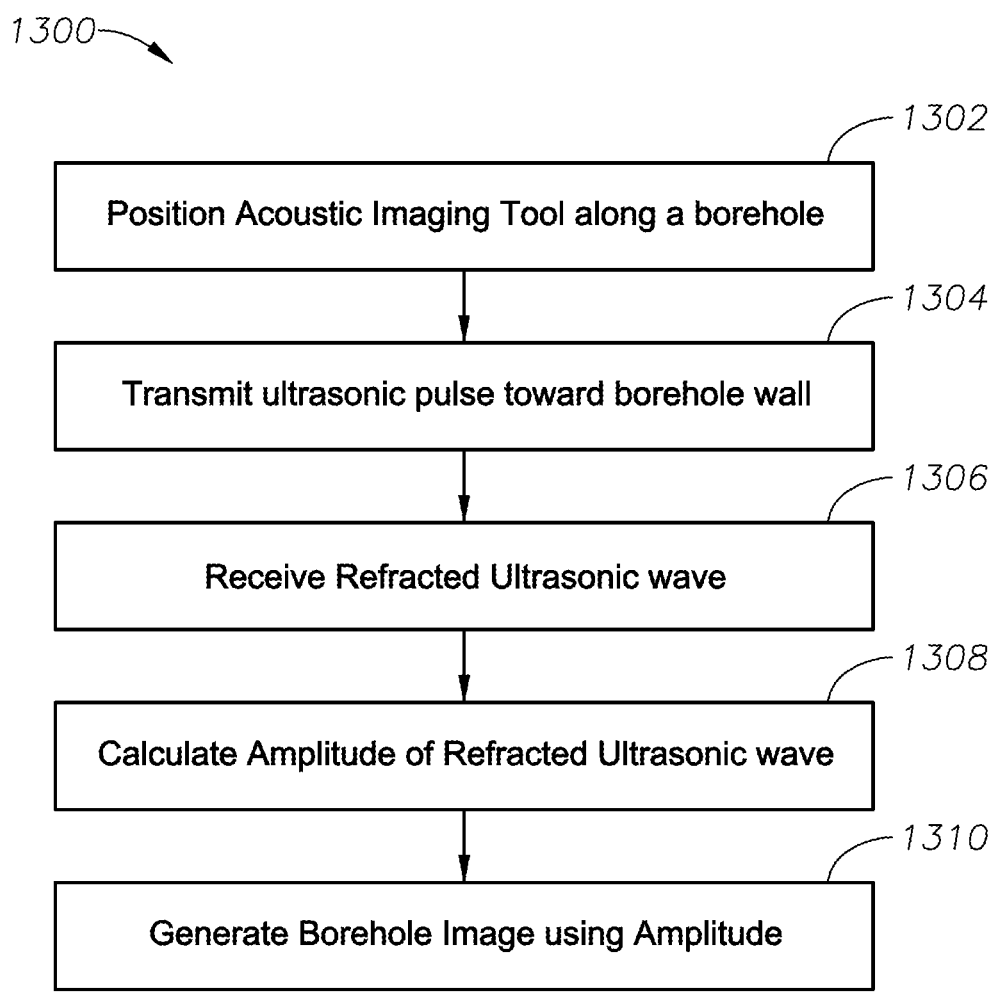
FIG. 13 is a flow chart of a method for imaging a borehole using an acoustic tool, according to certain illustrative methods of the present disclosure.

FIG. 13 is a flow chart of a method for imaging a borehole using an acoustic tool, according to certain illustrative methods of the present disclosure. At block 1302 of method 1300, the acoustic imaging tool is deployed downhole along a borehole to a desired axial position. At block 1304, ultrasonic acoustic impulses are transmitted toward the borehole wall, where they are refracted and received by one or more tool receivers at block 1306. Note that any number of receivers may be utilized herein. At block 1308, processing circuitry calculates the amplitude of the rerated ultrasonic waves to generate the borehole images as described herein at block 1310. Thereafter, the borehole images may be applied to plan, conduct, analyze, or otherwise enhance any variety of downhole related applications (e.g., fracture identification, structural dip analysis, stress analysis, borehole stability and breakout analysis, borehole profiling and calculation of cement volume).

Accordingly, the embodiments and methods described herein provide a variety of advantages. Compared to conventional velocity imaging methods, the present disclosure provides a higher contrast in the image produced, because the amplitude of a refracted wave is more sensitive to borehole discontinuity than sound velocity. For example, in FIG. 9, the simulation result has shown more than a 100% increase of amplitude. However, the same simulation result produced a 20% reduction of measurement using the velocity method. The methods described herein are also very sensitive to thin cracks (e.g., provides clear detection of cracks with less than 1 mm in width as demonstrated with simulation data). Embodiments of the disclosure are also sensitive to borehole surface discontinuities, such as fractures, or enlarged boreholes due to washout, while conventional velocity-based approaches are affected other conditions such as stress state at the borehole surface and variations of rock properties.

The amplitude approach of the present disclosure also makes use of shear waves, which are much higher in amplitude than compressional wave as shown in both simulation and experimental data. The conventional velocity based methods require accurate detection of arrival time, which can be difficult to identify accurately due to the presence of preceding compressional waves. Moreover, when fractures are encountered (using conventional velocity based methods), the waveforms spread in the time domain and mix into shear wave arrival, thus rendering the results almost useless.

Embodiments and methods described herein further relate to any one or more of the following paragraphs:

1. An acoustic borehole imaging method, comprising positioning an acoustic imaging tool along a borehole; transmitting an ultrasonic pulse toward a borehole wall, wherein the ultrasonic pulse interacts with the borehole wall to produce a refracted ultrasonic wave; receiving the refracted ultrasonic wave; calculating an amplitude of the refracted ultrasonic wave; and generating an image of the borehole using the amplitude of the refracted ultrasonic wave.

2. An acoustic borehole imaging method as defined in paragraph 1, further comprising identifying discontinuities in the borehole wall using the image.

3. An acoustic borehole imaging method as defined in paragraphs 1 or 2, wherein the acoustic imaging tool is positioned along the borehole as part of a logging-while-drilling assembly.

4. An acoustic borehole imaging method as defined in any of paragraphs 1-3, wherein the acoustic imaging tool is positioned along the borehole as part of a wireline assembly.

5. An acoustic borehole imaging method as defined in any of paragraphs 1-4, wherein generating the amplitude image comprises calculating an amplitude decay of the refracted ultrasonic wave; and approximating the amplitude decay as a trend, wherein deviations from the trend are used to identify fractures in the borehole wall.

6. An acoustic borehole imaging method as defined in any of paragraphs 1-5, wherein the acoustic imaging tool operates in a pitch-catch mode.

7. An acoustic borehole imaging method as defined in any of paragraphs 1-6, wherein the refracted ultrasonic wave is received using a receiver array of the acoustic imaging tool.

8. An acoustic borehole imaging method as defined in any of paragraphs 1-7, wherein the acoustic imaging tool has one or more receivers; and the method further comprises after receiving the refracted ultrasonic wave, shifting the acoustic imaging tool azimuthally or axially; transmitting a second ultrasonic pulse toward the borehole wall; receiving a second refracted ultrasonic wave; and calculating an amplitude of the second refracted ultrasonic wave used to generate the image of the borehole.

9. An acoustic borehole imaging method as defined in any of paragraphs 1-8, further comprising using the image to plan, conduct, or analyze a borehole operation.

10. An acoustic borehole imaging tool, comprising a transmitter to transmit an ultrasonic pulse toward a borehole wall, wherein the ultrasonic pulse interacts with the borehole wall to produce a refracted ultrasonic wave; a receiver to receive the refracted ultrasonic wave; and processing circuitry communicably coupled to the transmitter and receiver to thereby perform the operations of calculating an amplitude of the refracted ultrasonic wave; and generating an image of the borehole using the amplitude of the refracted ultrasonic wave.

11. An acoustic borehole imaging tool as defined in paragraph 10, further comprising identifying fractures in the borehole wall using the image.

12. An acoustic borehole imaging tool as defined in paragraphs 10 or 11, wherein the acoustic imaging tool is part of a logging-while-drilling assembly.

13. An acoustic borehole imaging tool as defined in any of paragraphs 10-12, wherein the acoustic imaging tool is part of a wireline assembly.

14. An acoustic borehole imaging tool as defined in any of paragraphs 10-13, wherein generating the amplitude image comprises calculating an amplitude decay of the refracted ultrasonic wave; and approximating the amplitude decay as a trend, wherein deviations from the trend are used to identify fractures in the borehole wall.

15. An acoustic borehole imaging tool as defined in any of paragraphs 10-14, wherein the acoustic imaging tool operates in a pitch-catch mode.

16. An acoustic borehole imaging tool as defined in any of paragraphs 10-15, wherein the receiver is a receiver array.

17. An acoustic borehole imaging tool as defined in any of paragraphs 10-16, wherein the receiver comprises one or more receivers that are azimuthally or axially shiftable; and the operations further comprise after receiving the refracted ultrasonic wave, shifting the acoustic imaging tool azimuthally or axially; transmitting a second ultrasonic pulse toward the borehole wall; receiving a second refracted ultrasonic wave; and calculating an amplitude of the second refracted ultrasonic wave used to generate the image of the borehole.

18. An acoustic borehole imaging tool as defined in any of paragraphs 10-18, further comprising using the image to plan, conduct, or analyze a borehole operation.

19. An acoustic borehole imaging method, comprising imaging a borehole using an acoustic logging-while-drilling ("LWD") imaging tool.

20. An acoustic borehole imaging method as defined in paragraph 19, wherein imaging the borehole is achieved using amplitude measurements of refracted ultrasonic waves.

21. An acoustic borehole imaging method as defined in paragraphs 19 or 20, further comprising using the imaging to identify fractures along the borehole.

Furthermore, the illustrative methods described herein may be implemented by a system comprising processing circuitry (e.g., a controller) or a non-transitory computer readable medium comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. An acoustic borehole imaging method, comprising:
positioning an acoustic imaging tool along a borehole;
transmitting an ultrasonic pulse toward a borehole wall, wherein the ultrasonic pulse interacts with the borehole wall to produce a refracted ultrasonic wave;
receiving the refracted ultrasonic wave;
calculating an amplitude of the refracted ultrasonic wave; and
generating an image of the borehole using the amplitude of the refracted ultrasonic wave,
wherein the image is generated by calculating an amplitude decay of the refracted ultrasonic wave, the amplitude decay being caused by an interaction between the ultrasonic pulse and a material discontinuity in the borehole wall that results in the refracted ultrasonic wave.

2. An acoustic borehole imaging method as defined in claim 1, further comprising identifying discontinuities in the borehole wall using the image.

3. An acoustic borehole imaging method as defined in claim 1, wherein the acoustic imaging tool is positioned along the borehole as part of a logging-while-drilling assembly or wireline assembly.

4. An acoustic borehole imaging method as defined in claim 1, wherein generating the amplitude image further comprises
approximating the amplitude decay as a trend,
wherein deviations from the trend are used to identify fractures in the borehole wall.

5. An acoustic borehole imaging method as defined in claim 1, wherein the acoustic imaging tool operates in a pitch-catch mode.

6. An acoustic borehole imaging method as defined in claim 1, wherein the refracted ultrasonic wave is received using a receiver array of the acoustic imaging tool.

7. An acoustic borehole imaging method as defined in claim 1, wherein:
the acoustic imaging tool has one or more receivers; and
the method further comprises:
after receiving the refracted ultrasonic wave, shifting the acoustic imaging tool azimuthally or axially;
transmitting a second ultrasonic pulse toward the borehole wall;
receiving a second refracted ultrasonic wave; and
calculating an amplitude of the second refracted ultrasonic wave used to generate the image of the borehole.

8. An acoustic borehole imaging method as defined in claim 1, further comprising using the image to plan, conduct, or analyze a borehole operation.

9. An acoustic borehole imaging tool, comprising:
a transmitter to transmit an ultrasonic pulse toward a borehole wall, wherein the ultrasonic pulse interacts with the borehole wall to produce a refracted ultrasonic wave;
a receiver to receive the refracted ultrasonic wave; and
processing circuitry communicably coupled to the transmitter and receiver to thereby perform the operations of:
calculating an amplitude of the refracted ultrasonic wave; and
generating an image of the borehole using the amplitude of the refracted ultrasonic wave,
wherein the image is generated by calculating an amplitude decay of the refracted ultrasonic wave, the amplitude decay being caused by an interaction between the ultrasonic pulse and a material discontinuity in the borehole wall that results in the refracted ultrasonic wave.

10. An acoustic borehole imaging tool as defined in claim 9, further comprising identifying fractures in the borehole wall using the image.

11. An acoustic borehole imaging tool as defined in claim 9, wherein the acoustic imaging tool is part of a logging-while-drilling assembly or a wireline assembly.

12. An acoustic borehole imaging tool as defined in claim 9, wherein generating the amplitude image comprises
approximating the amplitude decay as a trend,
wherein deviations from the trend are used to identify fractures in the borehole wall.

13. An acoustic borehole imaging tool as defined in claim 9, wherein the acoustic imaging tool operates in a pitch-catch mode.

14. An acoustic borehole imaging tool as defined in claim 9, wherein the receiver is a receiver array.

15. An acoustic borehole imaging tool as defined in claim 9, wherein:
the receiver comprises one or more receivers that are azimuthally or axially shiftable; and
the operations further comprise:
after receiving the refracted ultrasonic wave, shifting the acoustic imaging tool azimuthally or axially;
transmitting a second ultrasonic pulse toward the borehole wall;
receiving a second refracted ultrasonic wave; and
calculating an amplitude of the second refracted ultrasonic wave used to generate the image of the borehole.

16. An acoustic borehole imaging tool as defined in claim 9, further comprising using the image to plan, conduct, or analyze a borehole operation.

17. An acoustic borehole imaging method, comprising imaging a borehole using an acoustic logging-while-drilling ("LWD") imaging tool.

18. An acoustic borehole imaging method as defined in claim 17, wherein imaging the borehole is achieved using amplitude measurements of refracted ultrasonic waves.

19. An acoustic borehole imaging method as defined in claim 17, further comprising using the imaging to identify fractures along the borehole.

20. A non-transitory computer readable medium comprising instructions which, when executed by at least one processor, causes the processor to perform the method comprising:
positioning an acoustic imaging tool along a borehole;
transmitting an ultrasonic pulse toward a borehole wall, wherein the ultrasonic pulse interacts with the borehole wall to produce a refracted ultrasonic wave;
receiving the refracted ultrasonic wave;
calculating an amplitude of the refracted ultrasonic wave; and
generating an image of the borehole using the amplitude of the refracted ultrasonic wave,
wherein the image is generated by calculating an amplitude decay of the refracted ultrasonic wave, the amplitude decay being caused by an interaction between the ultrasonic pulse and a material discontinuity in the borehole wall that results in the refracted ultrasonic wave.

* * * * *